March 26, 1963 R. F. RUTZ 3,083,302

NEGATIVE RESISTANCE SEMICONDUCTOR DEVICE

Filed Dec. 15, 1958 2 Sheets-Sheet 1

INVENTOR
RICHARD F. RUTZ

BY Sughrue & Rothwell
ATTORNEYS

March 26, 1963 R. F. RUTZ 3,083,302

NEGATIVE RESISTANCE SEMICONDUCTOR DEVICE

Filed Dec. 15, 1958 2 Sheets-Sheet 2

INVENTOR
RICHARD F. RUTZ

BY Sughrue & Rothwell
ATTORNEYS

United States Patent Office 3,083,302
Patented Mar. 26, 1963

3,083,302
NEGATIVE RESISTANCE SEMICONDUCTOR DEVICE

Richard F. Rutz, Fishkill, N.Y., assignor to International Business Machines Corporation, New York, N.Y., a corporation of New York Filed Dec. 15, 1958, Ser. No. 780,300
14 Claims. (Cl. 307—88.5)

The invention relates to a negative resistance semiconductor and more particularly to such a device which exhibits a so-called hook characteristic. The invention also relates to a process for making such devices.

In the conventional hook semiconductors in the prior art of the type described in PNPN Transistor Switches by J. L. Moll et al., Proc. IRE, vol. 44, September 1956, the voltage at which the critical junction of the semiconductor breaks down to provide a rapidly increasing current through the transistor is well defined. However, not so well defined is the current through the transistor at which the negative resistance characteristic is evidenced. Consequently, in the conventional type of hook transistor, in the prior art there is little control over the point at which the voltage switches from the critical breakdown voltage across the transistor to a minimum voltage thereacross. Also, the current in this switching region is an irregular function of the voltage. Further, capacitive currents and variations in alpha of different portions of the prior art devices contribute to a response behavior which is different for different switching rates.

It is, therefore, an object of this invention to provide a negative resistance semiconductor device in which (1) the breakdown voltage of the critical junction is well defined whereupon the current through the device rapidly increases and (2) the value of current flowing through the transistor necessary to cause the hook action is also well defined. Additionally, the semiconductor device of this invention provides that the current flowing therethrough during the hooking action more nearly approaches a linear function of the voltage than has previously been available.

In accordance with his invention there is provided method and apparatus for providing a multiple junction semiconductor device functioning as a diode in which hook action is achieved by the avalanche breakdown of at least two of said junctions so that the critical voltage at which the first junction breaks down defines the initiation of high current, the flow of high current in turn flowing through the selected internal resistance in one zone produces a voltage drop which causes a second breakdown and initiates hook action which thus manifests the negative resistance characteristic of the device.

The term avalanche in this discussion is employed to include both avalanche or Zener mechanisms currently used in the art and any voltage sensitive similar breakdown mechanism.

Figure 1:
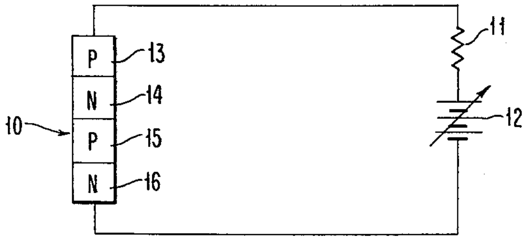
FIGURE 1 is a diagrammatic representation of a circuit including a conventional PNPN diode.
Figure 2:
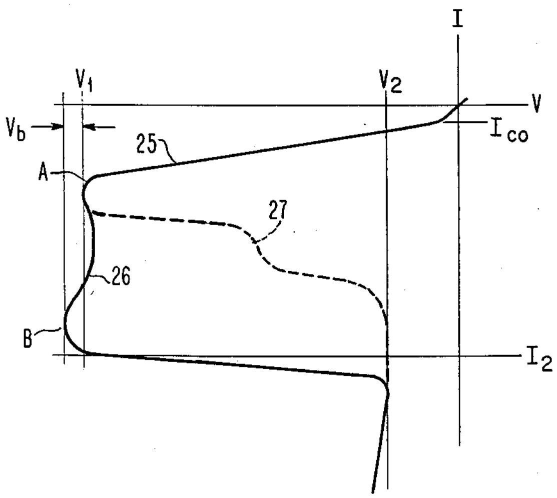
FIGURE 2 is a graphical illustration of voltage versus current under the conditions of operation of a negative resistance structure illustrating both the present invention and the prior art.
Figure 3:
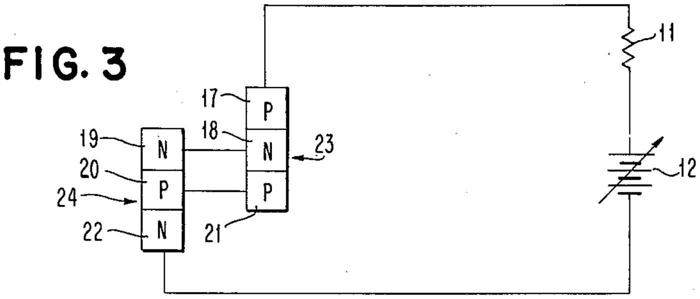
FIGURE 3 is an analytic illustration conventionally used to explain the functioning of a device such as FIGURE 1.

Referring first to FIGURES 1 to 3, inclusive, the diode 10 is a PNPN diode constructed in accordance with the prior art. It is connected in series with a resistor 11 to the plus side of a variable voltage source 12. The negative side of the source 12 is connected to the outermost N-region of the diode 10 and both are jointly connected to ground. Referring to FIGURE 3, there is shown a diagrammatic illustration of the functioning of the diode of FIGURE 1. Actually, the diode of FIGURE 1 acts in the circuit in a manner similar to the PNP and NPN transistors arranged in the manner shown in FIGURE 3. The P-region 13 of diode 10 is the same as the P-region 17 of transistor 23; the N-region 14 is the same as the N-regions 18 and 19 or transistors 23 and 24; the P-region 15 is the same as the P-regions 20 and 21 of the transistors 23 and 24, the N-region 16 is the same as the N-region 22 of transistor 24. The load resistor 11 is common in both of these diagrams, as is the variable voltage source 12. Upon the application of a relatively small voltage to the transistors 23 and 24, the PN diode of transistor 23 is forward biased. However, the NP diode 18 and 21 of transistor 23 and the NP diode 19 and 20 of transistor 24 are reversed biased. Consequently, the only current flowing therethrough is essentially the $I_{co}$ of these diodes which is the reverse leakage current therethrough of an extremely small value. As the voltage applied across the transistors increases this saturation current increases somewhat until finally both junctions defined between the NP diode of transistors 23 and 24 breakdown. At this time an increased amount of current is permitted to flow therethrough and the transistors in effect offer a greatly decreased impedance to current flow. When this happens the transistors combine to provide a negative resistance characteristic by virtue of the fact that the large current flow is accompanied by a decrease of voltage drop thereacross. The point at which the breakdown occurs is a function of the voltage applied across the transistor which reaches a critical value when the two NP diodes in the transistors 23 and 24 break down. The current rapidly increases to a stable value accompanied by a reduction in voltage across these two transistors. The current value at which this negative resistance characteristic is initiated is not well defined and also current in this critical region is an irregular function of the voltages. The operation of these two transistors 23 and 24 exemplifying the operation of a typical negative resistance device such as the diode 10 of FIGURE 1 is shown graphically by dotted line in FIGURE 2. As can be seen as the voltage increases across the transistor there is initially a very small increase in the current flow therethrough as represented by the portion of the curve labelled 25. However, when $V_1$ is reached, the current has reached a value which will cause breakdown of the critical junction in the diode 10 and at a certain current defined by the fact that the sum of the low voltage alpha of the individual portions of the device exceeds unity and the hook action is initiated. The voltage across the diode 10 collapses with an increase of current therethrough denoted by the portion of the curve labelled 27, thus manifesting the negative resistance characteristic.

The negative resistance device constructed in accordance with this invention, however, will function as illustrated by the solid line curve including indicative portions labelled 25 and 26 which describes the effect. The initial portion of the solid curve is substantially identical to the initial portion of the dotted curve. Here it can be seen that the current values at which the hook action B as well as the avalanche action A initiated are well defined. The current at the hook action B is identified as $I_2$. Also the current flow through the negative resistance device constructed in accordance with this invention during the collapse of voltage from $V_1$ to $V_2$ across the device is a more linear function of this voltage than is indicated by the portion 27 of the dotted curve.

Figure 4:
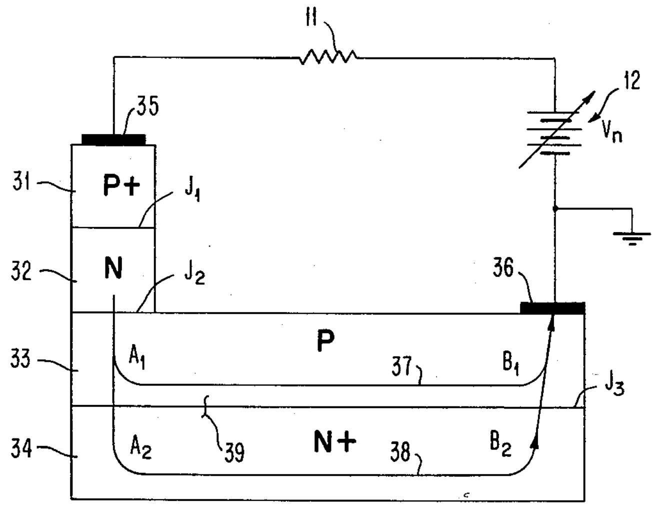
FIGURE 4 is a diagrammatic illustration of a negative resistance device constructed in accordance with this invention and employed in a circuit which will exemplify its functioning.

Now referring to FIGURE 4 which shows an embodiment employing the principles of the invention, the device is four-region PNPN semiconductor structure and in this illustration the two terminal ohmic connections 35 and 36 are now made to P-regions 31 and 33, respectively, while the N-regions 32 and 34 are left floating. As may be apparent to one skilled in the art connections to the floating regions may be made for single introduction purposes. P-regions 31 and N-regions 34 are more heavily doped with their respective impurities than are the two innermost N and P-regions 32 and 33, respectively. A region heavily doped provides less resistance to current passing therethrough than does a region lightly doped.

If a positive potential is applied to the top P-region 31 as shown in FIGURE 4, then the three PN junctions labelled $J_1$, $J_2$ and $J_3$ will be biased as indicated. Junction $J_1$ is biased in a forward direction since a more positive voltage is applied to the P-region 31 than is applied to N-region 32. Conversely, junction $J_2$ is reversed biased, since N-region 32 is at a more positive potential than is P-region 33. Junction $J_3$, however, will be both forward and reversed biased in different places as shown. This is due to the fact that the potential drop from point $A_1$ to point $B_1$ in P-region 33 due to the current flowing in path 37 will be greater than the potential drop between points $A_2$ and $B_2$ in the N-region 4 due to the current flowing in path 38. This is because the P-region 33 is more lightly doped than is the N-region 34, and thus provides more resistance to the flow of current. This difference in resistance can be further insured by making the N plus region 34 thin and covering it with a good conductor such as a solder coating not shown. This potential drop, then, between points $A_1$ and $B_1$ in the P-region 33 is of such a magnitude so as to cause the right-hand section of P-region 33 to be at a lower potential than is the right-hand section of N-region 34, thus creating a reverse bias at this section of the $J_3$-junction. Since the N+ region is of very low resistance, it may be considered to be equipotential throughout and point 39 is a point along the junction $J_3$ and the region 33 where the potential is equal to the potential of region 34. The device is further doped such that the reverse breakdown voltage for junction $J_2$ will be much greater than the reverse breakdown voltage for the righthand section of junction $J_3$. As will be subsequently explained, these doping requirements can be conveniently met by forming the P-region 33 by a diffusion operation so that it has low resistivity at junction $J_3$ and forming the N+ region.

For applied voltages $V_n$ across the semiconductor device which are less than the breakdown voltage for the junction $J_2$, only small reverse currents will flow across this junction and through parallel paths 10 and 11 to the base ohmic connection 36. The current through the essentially equipotential N-region 34 will be quite limited by the low reverse leakage current coming through the reversed bias section of junction $J_3$. Point A on the curve 25 shown in FIGURE 2 will be reached when the applied voltage $V_n$ equals the breakdown voltage for junction $J_2$, which corresponds to $V_1$ on the curve. Thus junction $J_2$, whose resistance has been decreased due to the avalanche breakdown phenomenon occurring at voltage $V_1$, will permit a higher current to flow into the bottom two P-N regions. This current is represented by the line 26 in FIGURE 2. The greater portion of this higher current will flow in path 37 of P-region 33 and will increase the potential drop between P-region 33 and N-region 34 at the right-hand section of junction $J_3$. When the drop across this right-hand section of junction $J_3$ reaches the breakdown voltage of $J_3$, then a large current begins to flow in path 38 through the N-region 34. The breakdown of junction $J_3$ is considered to occur at point B shown in the curve in FIGURE 2. Thus, at point B of FIGURE 2 there are now two large currents flowing in paths 37 and

38 of FIGURE 4. The sum of these two currents must equal the current flowing across junction $J_2$. It is therefore seen that the effective resistance of the parallel paths 37 and 38 is reduced when the voltage breakdown at the right hand section of $J_3$ is reached.

The variation in curvature at point A in the curve is due to the fact that the avalanche process can be sustained at a slightly lower voltage due to an increase in injection of holes from the P+ region 31 as current increase. This process in general, is the beginning of a negative resistance such as curve 27 of the prior art, however, in our device the built-in positive resistance in region 33 which overrides the negative resistance and provides a positive slope 26 to the portion of the curve between points A and B. In cases where the injection at junction $V_1$ is constant the voltage indicated as $V_b$ will equal $V_2$ and the slope of the portion 26 of the curve will be a measure of the effective resistance of zone 33.

The large current coming out of the forward biased region of junction $J_3$ will be minority carriers so that it acts as the emitter to the hook collector formed by P-region 31 and N-region 32. This large current, which is indicated at point B of FIGURE 2, now causes the voltage across the entire unit to collapse to voltage $V_2$ due to typical hook collector transistor action. A negative resistance characteristic is thus exhibited by the device. Since the only function of the P-region 31 and N-region 32 is to provide a PN hook collector, it is seen that this top junction $J_1$ may be replaced by any electrode with an inherent amplifying and multiplying action.

In summing up the above operation, it is seen that at point A of the curve shown in FIGURE 2 the breakdown voltage $V_1$ of junction $J_2$ is reached, thus causing more current to flow in path 37 of P-region 33 than was formerly flowing before voltage $V_1$ was reached. This increased current in path 37 causes the reverse bias on the right-hand section of junction $J_3$ to become greater, until the breakdown voltage of junction $J_3$ is attained, at which time point B has been reached on the curve of FIGURE 2. Upon the breaking down of the junction $J_3$ a large current can now begin to flow in path 38 as well as in path 37, thus creating a much larger current flow through the entire device and especially through junction $J_2$ and $J_1$. The typical hook action of the top PN hook collector now occurs wherein since region 34 is established by the broken down portion of $J_3$ at essentially reference potential any increase in flow through path 37 serves to increase the forward bias on the forward biased portion of $J_3$, increases the injection of minority carriers each of which liberates $\alpha$ majority carriers $\alpha$ thus causing the entire voltage across the device to revert to voltage $V_2$ as is shown in FIGURE 2.

Figure 5:
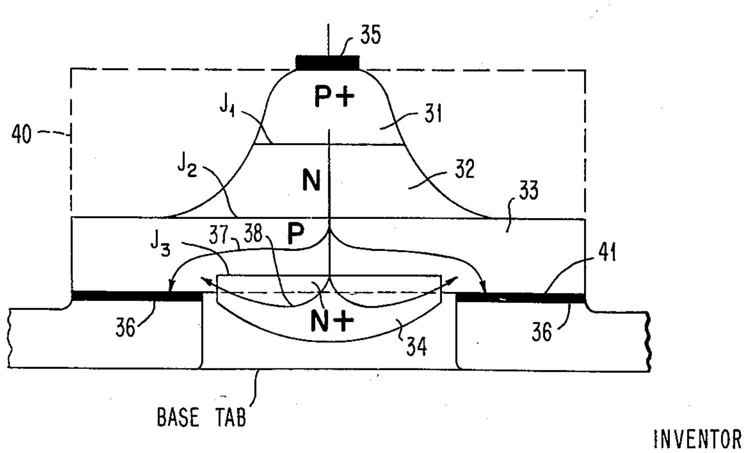
FIGURE 5 is a view showing a technique of construction of the diode of this invention.

Referring now to FIGURE 5, the technique of fabricating a physical embodiment employing the principles of the invention will now be described. The numbers used in FIGURE 4 to identify elements will likewise be used to denote the corresponding elements of FIGURE 5, which is a cross sectional view of the negative resistance device. An N-type crystal, whose degree of doping is of the amount desired for region 32 found in FIGURE 4, is first obtained by any conventional method. This initial crystal is denoted in FIGURE 5 by the dotted lines 40 and solid lines 41. By using the typical diffusion process with Indium as the acceptor impurity, for example, the top portion of the lightly doped N-crystal is now converted to a heavily doped P-region, such as is shown by region 31 in FIGURES 4 and 5. The diffusion process is also applied to the bottom of the N crystal but is controlled so that the P-region 33 need not be doped the same as is the P-region 31. The center region of the original lightly doped N-crystal remains as it was upon formation and is numbered region 32, corresponding to region 32 of FIGURE 4. A highly doped re-crystallized N-type region 34 may now be formed on the bottom of the P-region 33 by means of an alloy process well-known in the prior art. The dotted portions of the original N-type crystal are now etched away leaving the final structure as shown by the solid lines. Ohmic contact 36 is now attached to the base region 33. An ohmic contact 35 is also connected to the top P-region 31.

In the embodiment shown in FIGURE 5, it will now be seen that current flowing from the top PN regions through the P-region 33 to the base contact 36 will cause the center of the $J_3$ junction to be forward biased while the outer portions of the $J_3$ junction closest to the base contact 36 will be reversed biased, due to the potential drop created by the lateral flow of the current from the center of the transistor toward the outer base contacts 36. This is in accordance with FIGURE 4. It should be emphasized, however, that although the embodiment shown in FIGURE 5 is a preferred one, this configuration may be changed or modified to other forms which will give the desired characteristics. For example, the etching process may only be applied to one side of the N-type crystal instead of on both sides as is presently shown, so as to form an L-shaped structure as in FIGURE 4. The basic criterion to remember is that there must be a lateral current path through the P-region 33 parallel to the junction $J_3$ having more resistance than the lateral path through N+ region 34 in order to provide the required forward and reversed biased sections of that junction. Furthermore, one may begin with a P-type crystal and proceed to form by diffusion and alloy processes the necessary N-type regions.

In order to aid one skilled in the art in practicing the invention the following set of specifications is provided to make the device of FIGURE 5.

Starting with an N-type crystal of germanium 0.003 inch thick 0.030 diameter 1 ohm centimeter resistivity diffuse in indium from concentration of $10^{17}$ atoms/cc. at the surface to a depth of 0.001 inch on each side this forms wafer corresponding to the P-region 33, the N-region 32 and the P+ region 31. The N+ region 34 may be formed by alloying a sphere of 97% lead and 3% arsenic such that the final wet surface is 0.015 inch in diameter to a depth of penetration of 0.0003 inch, thus forming the N+ region 34. A circular base tab 36 having an opening of approximately 0.020 inch is positioned around the N+ region 34 and soldered to the P-region 33. The ohmic connection 35 is made with indium solder thus rendering the region 31, P+. Etching to remove the material encompassed by the dotted line 40, may be accomplished electrolytically using a sodium hydroxide solution with the P+ region 31 connected to the + or anode and the solution as the −r cathode. It will be apparent that the etching can continue until the physical size of the P region 33 is brought to a value which establishes a definite internal resistance and hence gives control of $I_2$ in FIGURE 2.

What has been described is a technique of controlling all of the changes in direction, slope, and switching points of a negative resistance semiconductor device by a combination of a current amplifying device having an intrinsic alpha greater than unity with a first breakdown of a first junction which results in a second breakdown of a second junction due to increased current resulting from the first breakdown flowing through an internal resistance in the device.

It will be apparent to one skilled in the art that this principle may be employed as a part of larger devices involving more than four regions. Further, signals may be introduced at parts of the device such as the N+ region 34 to initiate breakdown, inhibit breakdown or modify operations as desired.

Such alternative forms of the embodiment shown in FIGURE 5 are considered to be within the scope and spirit of the invention as now expressed in the appended claims.

I claim:

1. A hook-type semi-conductor device comprising a plurality of alternate regions of opposite conductivity types of semi-conductor material connected in series defining junctions therebetween, means providing a first reverse biased junction having a first breakdown potential between a first and a second opposite conductivity type region, means providing a second reverse biased junction having a second breakdown potential between said first and a third opposite conductivity type region, said first breakdown potential being greater than said second breakdown potential, the resistance of said first region being greater than said third region, means to introduce current across said first junction, an external current connection and means directing a portion of said introduced current across said second junction and back across said second junction to said current collector, the remainder of said current flowing directly from said first junction to said collector.

2. A device as claimed in claim 1 wherein said regions are four in number.

3. A device as claimed in claim 2 wherein said four regions form a PNPN device and said first reverse biased junction is formed between the inner N and P regions and said second reverse biased junction is formed between a portion of said inner P region and a portion of the outer N region.

4. A hook-type semi-conductor device comprising a plurality of regions of opposite conductivity semi-conductor material defining junctions therebetween, means providing a first reverse biased junction having a relatively high breakdown potential, means providing a second reverse biased junction having a relatively low breakdown potential, means connecting regions of one conductivity type of said first and second junctions to provide a current path therebetween of relatively high impedance and means connecting said region of one conductivity type of said first junction and a region of the other conductivity type of said second junction to provide a current path therebetween of relatively high impedance.

5. A hook-type semi-conductor device as defined in claim 4 in which the regions are four in number.

6. A device as claimed by claim 4 wherein said last-mentioned means comprises a floating region of said other conductivity type.

7. A hook-type semiconductor device as claimed in claim 5 in which said four regions formed a PNPN device and said first reverse biased junction is formed between the inner PN and P-regions and the second reverse biased junction is formed between a portion of said inner P and outer N regions.

8. A hook-type semiconductor device comprising a plurality of regions of opposite semiconductor material defining junctions therebetween, a first reverse biased junction defined between regions of opposite conductivity having a relatively low concentration of doping material dispersed therein to provide a junction having a relatively high breakdown potential, a second reverse biased junction defined between regions of opposite conductivity, one of said regions having a relatively high concentration of doping material dispersed therein to provide a junction having a relatively low breakdown potential, means connecting regions of one conductivity type of said first and second junctions to provide a current path therebetween of relatively high impedance and means connecting said region of the one conductivity type of said first junction and a region of the other conductivity type of said second junction to provide a current path therebetween of relatively high impedance.

9. A hook-type semiconductor device comprising a current amplifier, a first reverse biased junction defined by regions of opposite conductivity type, said junction having a relatively high breakdown potential, means to feed current from said amplifier to said first junction, a second reverse biased junction defined by regions of opposite semiconductor material type, said junction having a relatively low breakdown potential, means connecting regions of one conductivity of said first and second junctions to provide a current path therebetween of relatively high impedance and means connecting said region of one conductivity type of said first junction and a region of the other conductivity type of said second junction to provide a current path therebetween of relatively high impedance.

10. A device as claimed in claim 9 wherein said current amplifier comprises a forward biased junction formed between regions of semiconductor material of opposite conductivity type.

11. A hook-type semiconductor device comprising a plurality of regions of opposite conductivity types of semiconductor material defining junctions therebetween, means providing a first reverse biased junction having a relatively high breakdown potential, means providing a second reverse biased junction having a relatively low breakdown potential, one of said regions of said first junction having a lower concentration of doping material than the region of the same conductivity type of said second junction, the other of said regions of said first junction having a lower concentration of doping material than the remaining region of corresponding conductivity type, means to inject current across said first junction and to cause at least a portion of said current to flow across said second junction, a current collector means positioned with relation to said first and second junctions to collect all of said current flowing across said first junction.

12. A hook-type semiconductor device comprising a first P region, a first N region, a second P region and a second N region, said first P region and second N region having dispersed therein a relatively high concentration of doping material and said first N region and said second P region having dispersed therein a relatively low concentration of doping material, a first electrode connected to said first P region and a second electode connected to said second P region at a point thereon remote from at least a portion of a first junction defined between said first N and second P regions whereby at least a portion of the current flow through said device flows parallel to a second junction defined between said second P and second N regions to said second electrode.

13. A device as claimed by claim 12 wherein said second N region forms a junction with said second P region along only a portion of said second P region.

14. A hook-type semi-conductor device comprising a first P region, a first N region, a second P region and a second N region forming junctions therebetween, said first P and second N regions having a relatively high concentration of doping material dispersed therein and said first N and second P regions having a relatively low concentration of doping material dispersed therein, said second P region and said second N region defining a junction therebetween and providing parallel paths for current flowing across the junction defined between said first N and second P regions whereby the potential drop between corresponding points in said parallel paths varies lineally along said junction.

References Cited in the file of this patent

UNITED STATES PATENTS

| | | |
|---|---|---|
| 2,735,948 | Sziklai | Feb. 21, 1956 |
| 2,811,653 | Moore | Oct. 29, 1957 |
| 2,814,853 | Paskell | Dec. 3, 1957 |
| 2,838,617 | Tummers et al. | June 10, 1958 |
| 2,875,505 | Pfann | Mar. 3, 1959 |